United States Patent
Akiyama et al.

(10) Patent No.: US 8,021,964 B2
(45) Date of Patent: Sep. 20, 2011

(54) METHOD OF PRODUCING SEGMENTED CHIPS

(75) Inventors: Ryota Akiyama, Tokyo (JP); Kazuta Saito, Tokyo (JP)

(73) Assignee: 3M Innovative Properties Company, Saint Paul, MN (US)

( * ) Notice: Subject to any disclaimer, the term of this patent is extended or adjusted under 35 U.S.C. 154(b) by 286 days.

(21) Appl. No.: 12/303,813

(22) PCT Filed: Jun. 18, 2007

(86) PCT No.: PCT/US2007/071455
§ 371 (c)(1),
(2), (4) Date: Dec. 8, 2008

(87) PCT Pub. No.: WO2008/002790
PCT Pub. Date: Jan. 3, 2008

(65) Prior Publication Data
US 2010/0233867 A1    Sep. 16, 2010

(30) Foreign Application Priority Data

Jun. 27, 2006  (JP) ................................. 2006-176356

(51) Int. Cl.
*H01L 21/00*  (2006.01)
(52) U.S. Cl. ................ 438/460; 438/464; 257/E21.599; 257/E21.6
(58) Field of Classification Search ............... 257/E21.6; 438/464
See application file for complete search history.

(56) References Cited

U.S. PATENT DOCUMENTS

| 4,722,130 | A | 2/1988 | Kimura et al. |
| 6,184,109 | B1 | 2/2001 | Sasaki et al. |
| 6,649,445 | B1 * | 11/2003 | Qi et al. ........................ 438/108 |
| 2005/0233547 | A1 | 10/2005 | Noda et al. |
| 2006/0275949 | A1 * | 12/2006 | Farnworth et al. ............ 438/106 |

FOREIGN PATENT DOCUMENTS

| EP | 0 981 156 | 2/2000 |
| JP | 61-112345 | 5/1986 |
| JP | 05-335411 | 12/1993 |
| JP | 2002-373871 | 12/2002 |
| JP | 2003-209160 | 7/2003 |
| JP | 2004-064040 | 2/2004 |
| JP | 2005-191535 | 7/2005 |
| JP | 2005-197630 | 7/2005 |
| JP | 2005-285824 | 10/2005 |
| JP | 2005-303068 | 10/2005 |
| WO | WO 03/085714 | 10/2003 |

\* cited by examiner

*Primary Examiner* — Ha Tran T Nguyen
*Assistant Examiner* — Shaka Scarlett

(57) ABSTRACT

To provide a method of producing segmented chips preventing the chips from being damaged by the chip jumping or by the contact of the neighboring chips while the back surfaces thereof are being ground. A method of producing segmented chips by grinding the back surface of a material to be ground which includes a plurality of chips segmented into individual chips by at least partly cutting the chips in the direction of thickness thereof along the boundaries of the chips, wherein the gaps among the individual chips are filled with a liquid adhesive, the material to be ground is laminated on a rigid support material in a manner that the back surface thereof is exposed, and the adhesive is cured or solidified to form a laminate of the material to be ground having the plurality of chips, the adhesive solid material and the rigid support material arranged in this order; the laminate is ground from the back surface side of the material to be ground, the rigid support member is removed from the laminate, a flexible adhesive sheet is adhered onto the adhesive solid material, and the individual chips are picked up and recovered.

5 Claims, 5 Drawing Sheets

METHOD OF PRODUCING SEGMENTED CHIPS

TECHNICAL FIELD

The present invention relates to a method of producing segmented chips.

BACKGROUND

In recent years, it is a trend to produce semiconductor chips in reduced thickness, and it has been desired to decrease the thickness down to 50 to 100 μm or smaller. To decrease the thickness of the semiconductor chips, it is a generally accepted practice to grind the back surface of a wafer having a plurality of chips followed by dicing to form thin individual chips.

The following technologies have been known as methods of grinding the back surfaces.

First, a laminate structure comprising a wafer/an adhesive layer/a support material is fabricated by sticking a circuit surface of the wafer onto the support material via the adhesive layer. The wafer side of the laminate is ground to grind the back surface. After the back surface is ground, the support material and the adhesive layer are removed followed by dicing to divide the wafer into individual chips.

As the method of constituting the laminate comprising the wafer/adhesive layer/support material and as an exfoliating method therefor, there have been known methods of exfoliating and removing the adhesive layer and the support material, wherein a wafer is stuck onto an adhesive sheet obtained by providing, on, for example, a transparent resin support material, a pressure-sensitive adhesive layer that loses the adhering force upon being cured with ultraviolet rays and, after the back surface is ground, the adhesive sheet is irradiated with ultraviolet rays so that the adhesive sheet loses the adhering force (patent document JP-A-2002-373871, patent document JP-A-2003-209160 and patent document JP-A-2005-303068). There has further been known another method of exfoliating and removing a pressure-sensitive adhesive support material by sticking a wafer onto a pressure-sensitive adhesive substrate obtained by providing, on a transparent glass support material, a pressure-sensitive adhesive layer that foams and loses the adhering force upon the irradiation with ultraviolet rays, and by irradiating the adhesive layer with ultraviolet rays after the back surface has been ground (patent document JP-A-2005-197630). There has been known a further method of exfoliating and removing the support material by sticking a wafer, via a liquid adhesive layer, on a metallic, ceramic or glass support member having many through holes, solidifying the adhesive, grinding the back surface, and feeding a chemical solution that dissolves in the adhesive layer from the through holes (patent document JP-A-2005-191535). There has further been known a method wherein a wafer is stuck onto a glass support material having a special exfoliation layer on the surface thereof via a curable adhesive layer that cures by the external stimulation such as heat or ultraviolet rays, the back surface is ground in a state where the adhesive is cured and is held and, next, the exfoliation layer is exfoliated by using a laser to exfoliate and remove the support material (patent document JP-A-2004-64040).

There have further been disclosed so-called "pre-dicing methods" wherein grooves of a predetermined depth (also called half-cuts) are formed along the boundaries of the chips from the surface on the front surface side of the wafer (surface on where circuits are formed), and the back surface side of the wafer is ground to decrease the thickness of the chips, the grinding being continued so as to reach the bottoms of the grooves to divide the wafer into the individual chips (patent document JP-A-5-335411 and patent document JP-A-61-112345).

According to the above pre-dicing method as shown in FIG. 1, it is a generally accepted practice to fix a wafer 3 that is half cut along the boundaries of chips 4 to a support material 1 via an adhesive sheet 2, and to grind the back surface of the wafer 3. FIG. 1(a) is a schematic view of before and after grinding the chips of a small aspect ratio of when the circuit surface on the wafer is not so much rugged, half-cut portions are shallow, and the plane size (XY) of the chip is larger than the chip thickness (Z). In this case, the chips are stably fixed onto the wafer 3 and a favorable result of grinding is obtained. In recent years, however, there have been produced more chips having large ruggedness on the wafer circuit surface and more chips having large aspect ratios. FIG. 1(b) is a schematic view of before and after the grinding of when there are included chips of a large aspect ratio. When the back surface of the wafer 3 is to be ground, it becomes difficult to hold the chips 4 of a decreased thickness by using an adhesive sheet 2 and, hence, to smoothly grind the back surface. While grinding the back surface, further, there occur such problems as chip jumping or contact of the neighboring chips, causing the chips to be damaged.

SUMMARY

In conducting a pre-dicing method for effecting the dicing prior to grinding the back surface, it is an object of the present invention to provide a method of producing segmented chips preventing the chips from being damaged by the chip jumping or by the contact of the neighboring chips while the back surface is being ground irrespective of when forming chips having large ruggedness on the wafer circuit surfaces or chips having large aspect ratios.

According to one aspect of the present invention, there is provided (1) a method of producing segmented chips by grinding the back surface of a material to be ground which includes a plurality of chips segmented into individual chips by at least partly cutting the chips in the direction of thickness thereof along the boundaries of the chips; wherein the gaps among the individual chips formed by cutting are filled with a liquid adhesive, the material to be ground is laminated on a rigid support material in a manner that the back surface thereof is exposed, and the adhesive is cured or solidified to form a laminate of the material to be ground having the plurality of chips, the adhesive solid material and the rigid support material arranged in this order;

the laminate is ground from the back surface side of the material to be ground thereby to obtain thin and individually separated chips on the laminate;

the rigid support member is removed from the laminate;

a flexible adhesive sheet is adhered onto the adhesive solid material of the laminate from which the rigid support material has been removed; and the individual chips held by the adhesive solid material on said flexible adhesive sheet are picked up and recovered.

According to another aspect of the invention, there is provided (2) a method of producing segmented chips as described in (1) above, wherein the material to be ground has been partly cut before it is ground from the back surface thereof.

According to a further aspect of the invention, there is provided (3) a method of producing segmented chips as described in (1) above, wherein the material to be ground has been completely cut before it is ground from the back surface thereof According to a further aspect of the invention, there is provided (4) a method of producing segmented chips as described in (3) above, wherein the material to be ground is cut on an adhesive support material and, thereafter, a liquid adhesive is filled.

According to a further aspect of the invention, there is provided (5) a method of producing segmented chips as described in any one of (1) to (4) above, including a transfer step in which after the grinding, said laminate is adhered onto a first flexible adhesive sheet so as to come in contact with the back surfaces of the chips, the rigid support material is removed from the laminate, a second flexible adhesive sheet is adhered to the adhesive solid material of the laminate from which the rigid support material has been removed, and the first flexible adhesive sheet is removed.

According to a further aspect of the invention, there is provided (6) a method of producing segmented chips as described in (5) above, wherein in the transfer step, the first flexible adhesive sheet and the second flexible adhesive sheet are both pressure-sensitive adhesive sheets, and the adhering force of said second flexible adhesive sheet is two or more times as great as that of the first flexible adhesive sheet.

According to a further aspect of the invention, there is provided (7) a method of producing segmented chips as described in (5) above, wherein in the transfer step, the adhering force of the first flexible adhesive sheet becomes smaller than that of the second flexible adhesive sheet upon the application of heat or radiation to thereby allow the transfer.

According to a further aspect of the invention, there is provided (8) a method of producing segmented chips as described in any one of (1) to (7) above, wherein the liquid adhesive, at the time of filling, has a viscosity of smaller than 10,000 cps at 25° C., and the adhesive solid material after being cured or solidified has a storage modulus of elasticity of not smaller than 100 MPa at 25° C. and a storage modulus of elasticity of not smaller than 10 MPa at 50° C.

According to a further aspect of the invention, there is provided (9) a method of producing segmented chips as described in any one of (1) to (8) above, wherein in the step of picking up and recovering the individual chips held by said adhesive solid material on said flexible adhesive sheet, a tension is exerted on the flexible adhesive sheet to expand the adhesive solid material in a horizontal direction, to thereby facilitate the picking up.

In the present invention, the expression "filled with an adhesive" means that a gap does not have to be completely filled with an adhesive, as far as chip jumping and chip damage are prohibited during the back-side grinding.

According to the above method of the present invention, the chips are not damaged or the chips do not jump even in grinding the material to be ground including chips of large aspect ratios, and the material can be reliably ground and divided into chips. Further, the above method of the present invention makes it possible to easily pick up the segmented chips.

DETAILED DESCRIPTION OF THE PREFERRED EMBODIMENTS

Figure 1A:
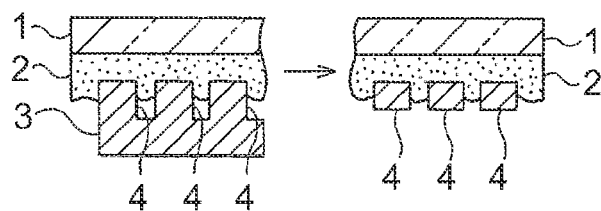
FIG. 1 is a sectional view of grinding the back surface of a wafer on a conventional sticky sheet.
Figure 1B:
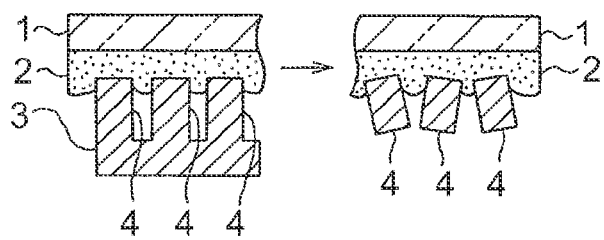

The invention will now be described by way of preferred embodiments. The scope of the invention, however, is not limited by the embodiments that are disclosed.

The present invention is concerned with a method of producing segmented chips by grinding the back surface of the material to be ground which includes a plurality of chips segmented into individual chips by at least partly cutting the chips in the direction of thickness thereof along the boundaries of the chips. In the specification, for convenience, the surface that is not to be ground of the material to be ground is called front surface, and the surface to be ground is called back surface.

1. Step of Forming a Laminate

In the method of the present invention, first, there is formed a laminate of a material to be ground having a plurality of chips, an adhesive solid material and a rigid support material which are arranged in this order. As the material to be ground, there can be exemplified a semiconductor wafer such as of silicon or gallium arsenic, or a brittle material such as quartz, sapphire or glass, that can be expected to be formed in a decreased thickness. The material to be ground is partly cut (also called "half-cut") or is completely cut (also called "full-cut") in the direction of thickness thereof on an adhesive support material. The cutting can be effected by using a diamond blade or a laser scriber. The cutting is effected along the boundaries of the chips and, usually, forms a lattice pattern on the surface of the material to be ground. When the half-cut is used, the depth of cutting becomes equal to, or greater than, the finished thickness of the chip.

Next, gaps among the chips formed by cutting are filled with a liquid adhesive. The adhesive may be any one of the curable adhesive, solvent adhesive, hot-melt adhesive or water-dispersing adhesive. The curable adhesive is a liquid adhesive that is cured by energy rays such as heat or ultraviolet rays, the solvent adhesive is the one that solidifies as the solvent vaporizes, and the hot-melt adhesive is the one that is melted by heating and is solidified by cooling. The water-dispersing adhesive is the one in which an adhesive component is dispersed in the water, and solidifies as the water vaporizes. As the curable adhesive, there can be exemplified a one-part heat-curable adhesive using an epoxy or an urethane as a base, a two-parts mixed reaction type adhesive using an epoxy, an urethane or an acrylic as a base, and an ultraviolet ray-curable or electron ray-curable adhesive using an acrylic or an epoxy as a base. As the solvent adhesive, there can be exemplified a rubber adhesive obtained by dissolving a rubber or an elastomer in a solvent. The adhesive fills half-cut or full-cut portions and surface ruggedness of the material to be ground, and constitutes a junction layer to the rigid support material. In order to uniform the thickness of the adhesive layer, it is desired that the liquid adhesive has a viscosity of smaller than 10,000 cps before it is cured or solidified in a working environment (e.g., 25° C.). The viscosity is measured in an environment of 25° C. by using a type B rotary viscometer (calculated as (viscosity=(indicated value)×(multiplier) depending upon the rotor shape and the rotational speed). More concretely, the viscosity is measured by using the Brookfield viscometer (BM) with a rotor shape No. 2 at a rotational speed of 12 rpm at 25° C. It is desired that a storage modulus of elasticity of not smaller than 100 MPa is possessed by the solvent adhesive after the solvent is removed, by the curable adhesive after it is cured or by the hot-melt adhesive in an environment (e.g., 25° C.) where it is used after solidified at normal temperature. It is further desired that a storage modulus of elasticity of not smaller than 10 MPa is possessed by them at 50° C. which is a temperature reached when the back surface is being ground. This is because, the material to be ground can be uniformly ground without being distorted by the stress applied at the time of grinding. The storage modulus of elasticity is a value measured in a temperature ramp mode, a tension mode, a frequency of 1 Hz, a strain of 0.04%, a temperature ramp rate of 5° C./min and by using an adhesive of a sample size of 22.7 mm×10 mm×50 μm. The storage modulus of elasticity can be measured by using a SOLIDS ANALYZER RSA II (trade name) manufactured by Rheometrix Co. Further, it is desired that the adhering force of the adhesive layer to the material to be ground is 0.1 to 0.5 N/25 mm and, more desirably, 0.1 to 0.2 N/25 mm to avoid the infiltration of water and chipping in the step of grinding the back surface. The adhering force is a value measured in compliance with the JIS Z 0237 (A test piece of a width of 25 mm is cut and is press-adhered onto a test plate by causing it to undergo a round trip at a speed of 5 mm a second by using a rubber roller of 2.0 Kg. During a period of 20 to 40 minutes after press-adhered, the test piece is exfoliated by using a tension tester in a direction of 180° at a speed of 300±30 mm a minute. The to-be-adhered material is a SUS430BA plate). There is no particular limitation on the thickness of the adhesive layer provided it is capable of absorbing ruggedness of the material to be ground to a sufficient degree. Typically, however, the thickness thereof is 10 to 150 μm and, desirably, 20 to 100 μm.

Next, the material to be ground is laminated on the rigid support material via the adhesive layer before the liquid adhesive is cured or solidified. It is desired that the rigid support material has a rigidity large enough to prevent the material to be ground from warping at the time of grinding the back surface thereof and to conduct the grinding without distortion. Roughly, the support material must have a flexural modulus of elasticity of not smaller than 2,000 MPa and, more preferably, not smaller than 20,000 MPa. The flexural modulus of elasticity is measured in compliance with JIS H 7406 (method of testing the bending of fiber-reinforced metals), JIS K 7171 (method of testing bending characteristics of plastics), and JIS K 6911 (method of testing general properties of thermoplastic materials). As the support materials that can be used, there can be exemplified sheet materials of such resins as acrylic (3200 MPa), epoxy, polycarbonate (2400 MPa), polyethylene terephthalate (9000 MPa), acrylonitrilebutadiene styrene polymer (2100 MPa) and polyimide (3000 MPa), as well as glass (70,000 MPa), aluminum (70,000) and stainless steel (180,000 MPa). Numerals in parentheses are representative values. The support material may pass through the processes of frictional heat at the time of grinding the back surface, vacuum evaporation, sputtering, electroplating and etching. A support material having a heat resistance, resistance against chemicals and a low coefficient of thermal expansion is desirably selected depending upon the above process conditions. From the standpoint of providing these properties, transparency for easy watching and transmission of radiant rays for curing, there can be exemplified Pyrex (registered trademark), Tempax, quartz and coning. The thickness of the rigid support material is typically 200 to 2,000 μm and, preferably, 500 to 1,000 μm though it may vary depending upon the flexural modulus of elasticity possessed by the material.

In order to carry out the steps of up to recovering the individual chips through the final step of pickup after the back surface of the material to be ground has been ground, it is necessary to remove the rigid support material. Though there is no limitation on the method of exfoliating the rigid support material from the adhesive layer and the material to be ground, it is convenient if the adhesive solid material and the rigid support material are joined together via an exfoliation layer. It is considered that the exfoliation layer is the one that decomposes when it is immersed in a chemical solution or when it is imparted with an external stimulus such as heat or irradiation with a laser beam.

Concretely described below is how to form the laminate of the material to be ground having a plurality of chips, adhesive solid material and rigid support material arranged in this order.

Figure 2:
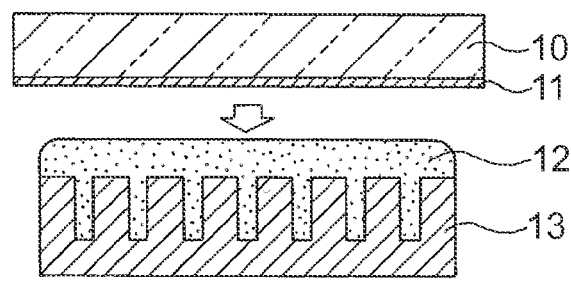
FIG. 2 is a schematic sectional view of producing a laminate including a material to be ground.

Referring to, for example, FIG. 2, a material to be ground 13 half-cut along the boundaries of the chips to define the individual chips is spin-coated with a liquid adhesive agent 12. The adhesive 12 on the material to be ground 13 is arranged to be opposed to the exfoliation layer 11 on the rigid support material 10, and the two are stuck together by being pressed from one side or from both sides. Here, if the air infiltrates into between the layers, the laminate is prevented from possessing a uniform thickness. Therefore, the material to be ground 13 cannot be uniformly ground. To prevent the infiltration of the air into between the layers, it is desired that the sticking is conducted in vacuum.

Figure 3:
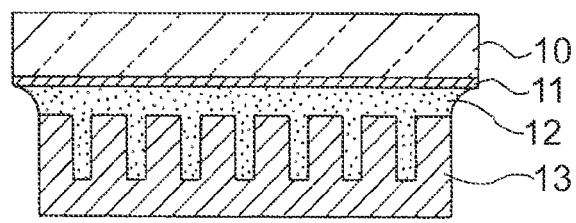
FIG. 3 is a schematic sectional view of producing a laminate including a material to be ground.
Figure 4:
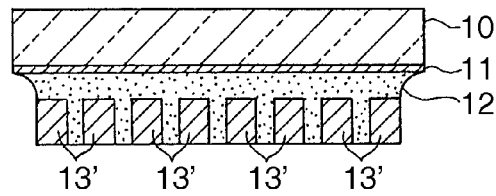
FIG. 4 is a sectional view of a laminate after the back surface is ground.

After the material to be ground 13 and the rigid support material 10 are stuck together via the adhesive 12, the liquid adhesive 12 is cured or solidified. When, for example, the rigid support material 10 is a glass support material and the adhesive layer 12 is the one that cures by being irradiated with ultraviolet rays, the adhesive 12 is cured by irradiating the rigid support material 10 with ultraviolet rays from the side of the back surface thereof. Thus, there is produced a laminate shown in FIG. 3 in which the half-cut portions (street portions) of the material to be ground 13 is completely filled with the adhesive 12.

Further, through not illustrated, the material to be ground may be fully cut. To fully cut the material to be ground, for example, the material to be ground is fixed onto the adhesive support material and is fully cut by using dicing means same as the one used for the half-cutting. Thereafter, the material to be ground fixed onto the support material is spin-coated with the liquid adhesive thereby to form the laminate in quite the same manner as described above. After the laminate is formed, the adhesive support material is exfoliated, followed by the next step of grinding the back surface.

2. Step of Grinding the Back Surface

Figure 14:
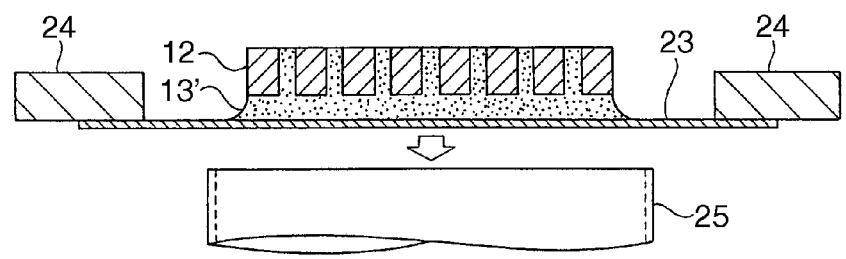
FIG. 14 is a schematic sectional view of a transfer step (step of flip-transferring the chips).

The laminate obtained as described above is fixed to a grinder and is ground on its back surface from the side of the back surface of the material to be ground 13 of the laminate down to a thickness corresponding to the depth of the half-cut portions thereby to obtain segmented chips 13' as shown in FIG. 14. Street portions among the neighboring segmented chips 13' are filled with the adhesive 12. Therefore, even the segmented chips of a high aspect ratio having deep half-cut portions are prevented from being damaged by the contact among the chips or are prevented from jumping.

3. Step of Removing the Rigid Support Material

The rigid support material 10 is removed after the segmented chips 13' have been formed by grinding the back surface. It is considered that the exfoliation layer 11 is the one that dissolves, melts or decomposes when it is immersed in a chemical solution or when it is imparted with an external stimulus such as heating or irradiation with a laser beam.

As the exfoliation layer that decomposes upon the irradiation with a laser beam, there can be exemplified a light-heat conversion layer. The light-heat conversion layer contains a light absorber and a pyrolytic resin. Radiant energy projected onto the light-heat conversion layer in the form of a laser beam is absorbed by the light absorber and is converted into heat energy. Heat energy that is generated works to rapidly elevate the temperature of the light-heat conversion layer. The temperature finally reaches a pyrolytic temperature of the pyrolytic resin (organic component) in the light-heat conversion layer, and the resin undergoes the pyrolysis. Gases generated due to the pyrolysis forms a void layer (voids) in the light-heat conversion layer which, therefore, is divided into two; i.e., the rigid support material and the material to be ground are separated from each other.

The light absorber is for absorbing radiant energy of a wavelength that is used. As radiant energy, therefore, there can be usually used a laser beam of a wavelength of 300 to 2000 nm. Concretely, therefore, there can be used a YAG laser that generates light of a wavelength of 1064 nm, a double harmonic YAG laser of a wavelength of 532 nm, and a semiconductor laser of a wavelength of 780 to 1300 nm. As the light absorber, there can be used a fine particulate metal powder such as of carbon black, graphite, iron, aluminum, copper, nickel, cobalt, manganese, chromium, zinc or tellurium; a metal oxide powder such as of black titanium oxide; or a dye or a pigment such as of aromatic diamino metal complex, aliphatic diamine metal complex, aromatic dithiol metal complex, mercaptophenol metal complex, squalirium compound, cyanine coloring matter, methine coloring matter, naphthoquinone coloring matter or anthraquinone coloring matter, though it may be selected depending upon the wavelength of the laser beam. Among the light absorbers, carbon black is particularly useful. This is because, carbon black significantly lowers the exfoliation force which is necessary for exfoliating the base material after irradiated with radiant energy from the support material to accelerate the separation.

The concentration of the light absorber in the light-heat conversion layer may vary depending upon the kind of the light absorber, form (structure) of the particles and the degree of dispersion, but is, usually, 5 to 70% by volume in the case of generally employed carbon black having a particle size of about 5 to about 500 nm. When the concentration is smaller than 5% by volume, heat generated by the light-heat conversion layer is not often sufficient for decomposing the pyrolytic resin. When the concentration exceeds 70% by volume, on the other hand, the light-heat conversion layer cannot be favorably formed causing defective adhesion to other layers. When the adhesive used as the junction layer is a UV-curable adhesive, carbon black that is used in too large amounts causes a decrease in the transmission of ultraviolet rays for curing the adhesive. When the UV-curable adhesive is used as the junction layer, therefore, the amount of carbon black should not be larger than 60% by volume. From the standpoint of decreasing the exfoliation force at the time of removing the support material after the irradiation with radiant energy and of preventing the wear of the light-heat conversion layer during the grinding, it is desired that the carbon black is contained in the light-heat conversion layer in an amount of 20 to 60% by volume and, more desirably, in an amount of 35 to 55% by volume.

As the pyrolytic resin, there can be exemplified gelatin, cellulose, cellulose ester (e.g., cellulose acetate, nitrocellulose), polyphenol, polyvinyl butyral, polyvinyl acetal, polycarbonate, polyurethane, polyester, polyorthoester, polyacetal, polyvinyl alcohol, polyvinyl pyrrolidone, copolymer of vinylidene chloride and acrylonitrile, poly(meth)acrylate, polyvinyl chloride, and block copolymer containing silicone resin and/or polyurethane unit, which can be used in one kind or in two or more kinds being mixed together.

The exfoliation layer may, for example, be the one that acts upon being heated. As the above material, there can be used a polymer that melts when heated. When grinding the back surface, however, the material to be ground is often heated up to about 40 to about 70° C. due to the heat by friction. Therefore, there should be used a polymer having a melting point higher than the above value. Concretely, there can be used paraffin wax, microcrystalline wax, petrolatum, carnauba wax, ceresine wax, castor wax, candelilla wax, polyolefin wax, polyethylene oxide wax, ketone wax and fatty acid amide. Further, the exfoliation layer may be made of a material that acts when being immersed in a chemical solution. The above material may be, for example, an organic polymer soluble in an organic solvent such as alcohol or ketone. When the exfoliation layer is of a material that acts upon being immersed in a chemical solution, the rigid support material should be a porous support material that permits the chemical solution to permeate through.

The exfoliation layer, however, may not be necessarily used when the adhesive forming the adhesive layer is the one of the hot-melting type or is the one that dissolves in a solvent.

FIGS. 5 to 8 illustrate procedures of the steps of removing the rigid support material.

Figure 5:
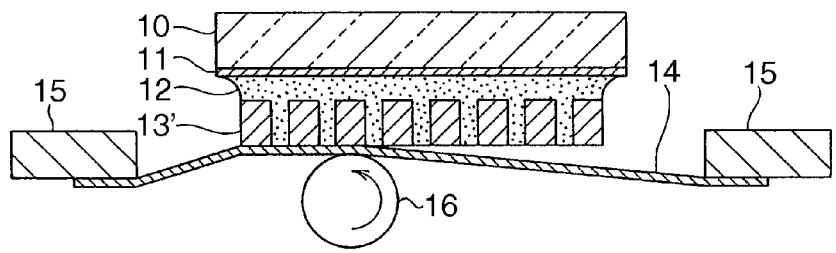
FIG. 5 is a schematic sectional view of a step of removing a rigid support material.

Referring to FIG. 5, a first adhesive sheet 14 mounted on a ring frame 15 is laminated on the ground surface of the laminate by using a roller 16. It is desired that the initial adhering force of the first adhesive sheet 14 is 0.2 to 2.0 N/cm with respect to the ground surface of the laminate, so that the laminate (segmented chip) will not split off at the time of conveyance or exfoliating the rigid support material 10. The adhering force is a value measured in compliance with the JIS Z 0237 (A test piece of a width of 25 mm is cut and is press-adhered onto a test plate by causing it to undergo a round trip at a speed of 5 mm a second by using a rubber roller of 2.0 Kg. During a period of 20 to 40 minutes after press-adhered, the test piece is exfoliated by using a tension tester in a direction of 180° at a speed of 300±30 mm a minute. The material to be adhered is a SUS430BA plate). Though there is no particular limitation, the thickness of the first adhesive sheet 14 is typically 10 to 200 μm. It is desired that the first adhesive sheet 14 has a tensile strength of not smaller than 10 N/cm and an elongation percentage at breaking point of not smaller than 200% so as to withstand the transit, expansion and breakage. The tensile strength and the elongation percentage at breaking point are values measured in compliance with the JIS Z 0237 (a test piece of a width of 15 mm is cut and pulled by using a tensile tester at a speed of about 5 mm a second maintaining a distance between the indicators of 50 mm, to measure the load and elongation at breaking) As the first adhesive sheet, there can be used a sticky sheet. Further, it is particularly desired if the first adhesive sheet 14 has such a property that the adhesive force thereof decreases upon receiving the external stimulus. The first adhesive sheet will be described later in detail in the paragraph of "Transfer Step" (step of flip-transplanting the chips) appearing later.

Figure 6:
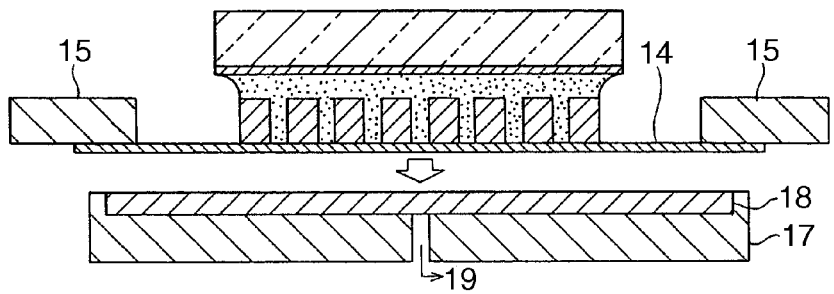
FIG. 6 is a schematic sectional view of a step of removing the rigid support material.

Referring next to FIG. 6, the laminate adhered onto the first adhesive sheet 14 fixed to the ring frame 15 is placed on a bed seat 17 and is secured thereto by adsorption. It is desired that the surface 18 of the bed plate is made of a porous metal such as a sintered metal or ceramics and that the first adhesive sheet 14 is fixed onto the bed seat 17 by adsorption by suction from a source 19 of reduced pressure located on the lower side. It is desired that the area of adsorption on the surface 18 of the bed plate is wider than at least the outer extension of the group of chips 13'.

Figure 7:
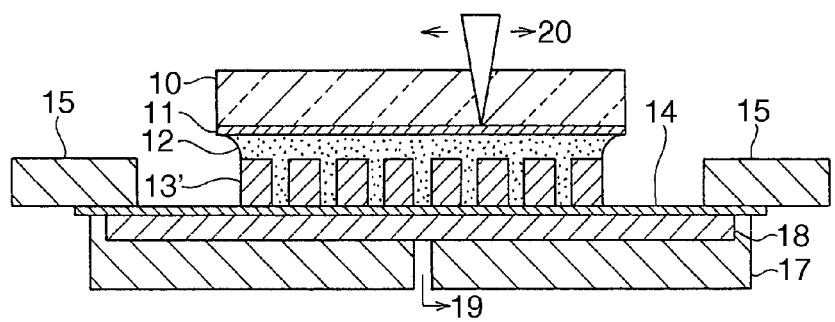
FIG. 7 is a schematic sectional view of a step of removing the rigid support material.
Figure 8:
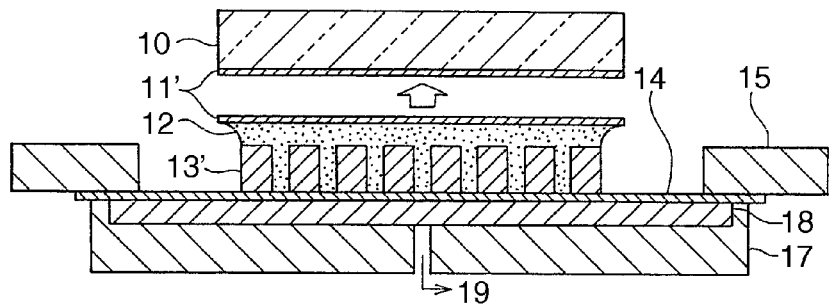
FIG. 8 is a schematic sectional view of a step of removing the rigid support material.

Referring next to FIG. 7, external stimulus 20 is given from the back surface side of the rigid support material 10 to activate the exfoliation layer 11. When the exfoliation layer 11 is a light-heat conversion layer, the external stimulus 20 is radiant energy such as a laser beam which is, then, converted into heat energy. Due to the converted energy, the exfoliation layer 11 is decomposed, and the rigid support material 10 and the adhesive layer 12 are separated from each other. Referring next to FIG. 8, the rigid support material is exfoliated upward. Thus, the adhesive layer 12 is exposed, and there is obtained a laminate with the ground surface (segmented chips 13') of the material to be ground in contact with the first adhesive sheet 14.

Further, the exfoliation layer 11 can be formed by using a chemically dissolving material. In this case, the external stimulus 20 is a chemical agent which dissolves the exfoliation layer 11 causing the rigid support material 10 and the adhesive layer 12 to be separated away from each other. As the chemical agent, there can be used such a solvent as alcohol or ketone. The exfoliation layer 11 may be a polymer material that can be dissolved in the above solvent. When the exfoliation layer 11 is chemically dissolving, it is desired that the rigid support material 10 permits the chemical agent to permeate through so as to accelerate the dissolution of the exfoliation layer 11 and is, for example, formed by using a porous material such as a porous stainless steel or a porous glass.

Further, the exfoliation layer 11 can be formed by using a heat-melting material. In this case, the external stimulus 20 is heat. The exfoliation layer 11 is melted by heat, and the rigid support material and the adhesive layer 12 are separated from each other. As the heat-melting material, there can be used a low-melting polymer or a wax. Here, however, the heat-melting material is the one that can withstand the heat in the step of grinding the back surface.

When it is attempted to forcibly exfoliate the adhesive layer 12 particularly in a case where the chips have such a high aspect ratio that the depth of the street portions (half-cut grooves) is not smaller than 100 μm, the adhesive layer 12 undergoes the aggregation breakdown in a state where the adhesive is left in the street portions. In order to prevent the adhesive layer from being left, there are conducted the "trans-fer step" (step of flip-transfer) and the "step of picking up the segmented chips" as described below.

4. Transfer Step (Step of Flip-Transferring the Chips)

Figure 9:
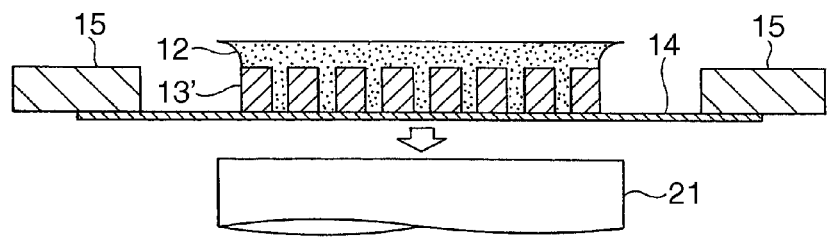
FIG. 9 is a schematic sectional view of a transfer step (step of flip-transferring the chips).
Figure 10:
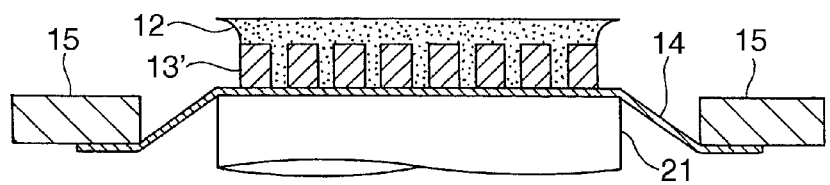
FIG. 10 is a schematic sectional view of a transfer step (step of flip-transferring the chips).

The laminate including the segmented chips 13' from which the rigid support material is removed is adhered onto the first adhesive sheet 14, fixed by the ring frame 15, and is subjected to the transfer step (step of flip-transplanting the chips) as shown in FIGS. 9 to 13. First, there is prepared a cylindrical bed seat 21 having a flat surface of a size larger than the size of the laminate and encompassing the grinding surface of the laminate. Referring to FIG. 9, the ring frame 15 placing the above laminate thereon is mounted on the cylindrical bed seat 21. Referring next to FIG. 10, the ring flame 15 is vertically pushed down so that at least the upper surface of the ring frame 15 becomes lower than the upper surface of the bed seat 21. Therefore, the first adhesive seat 14 is expanded, and the laminated portion only is protruded.

Figure 11:
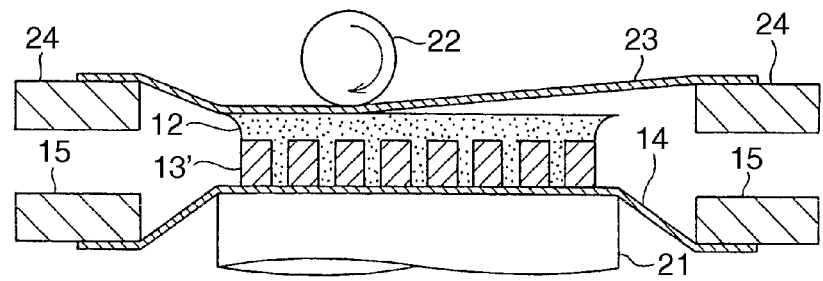
FIG. 11 is a schematic sectional view of a transfer step (step of flip-transferring the chips).

In this state as shown in FIG. 11, a second adhesive sheet 23 mounted on a ring frame 24 is laminated on the adhesive layer 12 of the laminate by using a roller 22. As described above, the laminated portion only is protruding on the cylindrical bed seat 21. Therefore, the adhering surfaces of the first adhesive sheet 14 and of the second adhesive sheet 23 are avoided from coming in direct contact with each other.

Next, the laminate is transferred (flip-transferred) from the first adhesive sheet 14 onto the second adhesive sheet 23. In this case, the first adhesive sheet 14 can be easily exfoliated in the "transfer step" (step of flip transfer). For this purpose, the adhering force of the first adhesive sheet in the transfer step must be smaller than the adhering force of the adhesive sheet on the side to be transferred (hereinafter called "second adhesive sheet"). For example, there are used the first adhesive sheet and the second adhesive sheet which are both sticky sheets, the adhering force of the first adhesive sheet being smaller than the adhering force of the second adhesive sheet. It is particularly desired that the first adhesive sheet 14 has such a nature that the adhering force thereof decreases when stimulated from the outer side. The above adhesive sheet maintains a sufficiently large adhering force at the time of transit or at the time of exfoliating the rigid support material, but its adhering force can be easily lowered upon being imparted with an external stimulus at the time when it is to be exfoliated. The external stimulus may be heat or light, and there can be used an adhesive of which the adhering force decreases when it is cured by light or heat, or an adhesive of which the adhering force can be decreased by foaming upon being heated. As the known photo-curable sticky sheets, there can be exemplified Sumilite FSL-N4000 Series manufactured by Sumitomo Bakelite Co., Adwill-D Series manufactured by Furukawa Denko Co., and Elepholder UE Series manufactured by Nitto Denko Co. Here, when the photo-curable adhesive sheet is used as the first adhesive sheet, the material of the bed seat 21 is desirably a glass or the like that transmits ultraviolet rays.

Figure 12:
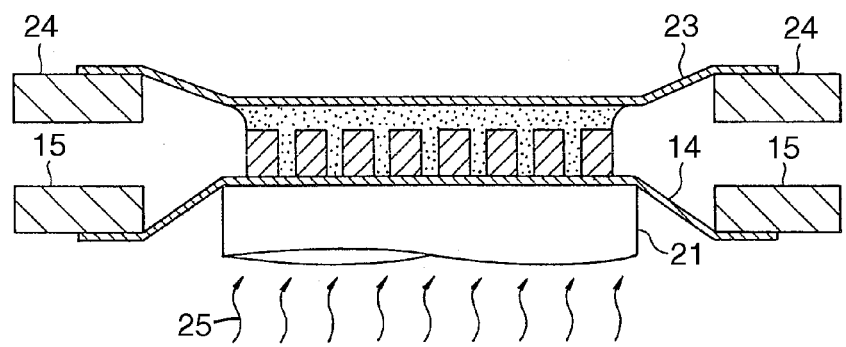
FIG. 12 is a schematic sectional view of a transfer step (step of flip-transferring the chips).
Figure 13:
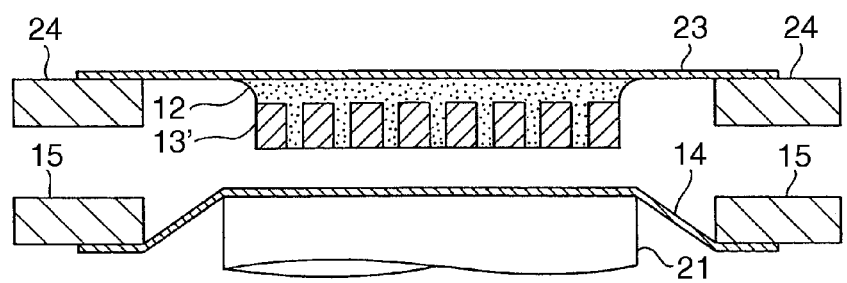
FIG. 13 is a schematic sectional view of a transfer step (step of flip-transferring the chips).

In FIG. 11, after the second adhesive sheet 23 is adhered onto the laminate by the roller 22, external stimulation 25 is imparted, as required, as shown in FIG. 12 to lower the adhering force of the first adhesive sheet 14. Next, when the distance is increased between the ring frames 15 and 24, the first adhesive sheet 14 is exfoliated and the flip transfer takes place as shown in FIG. 13 due to a difference in the adhering forces between the first adhesive sheet 14 and the second adhesive sheet 23.

In conducting the flip-transfer, it is desired that the adhering force of the second adhesive sheet 23 relative to the adhesive layer 12 is not smaller than two times as great as the adhering force of the first adhesive sheet 14 relative to the surface that is to be ground, and is not smaller than 2.0 N/cm.

Here, the adhering force is a value measured in compliance with the JIS Z 0237 (A test piece of a width of 25 mm is cut and is press-adhered onto a test plate by causing it to undergo a round trip at a speed of 5 mm a second by using a rubber roller of 2.0 Kg. During a period of 20 to 40 minutes after press-adhered, the test piece is peeled by using a tension tester in a direction of 180° at a speed of 300±30 mm a minute. The to-be-adhered material is a SUS430BA plate).

5. Step of Picking up the Segmented Chips

Figure 15:
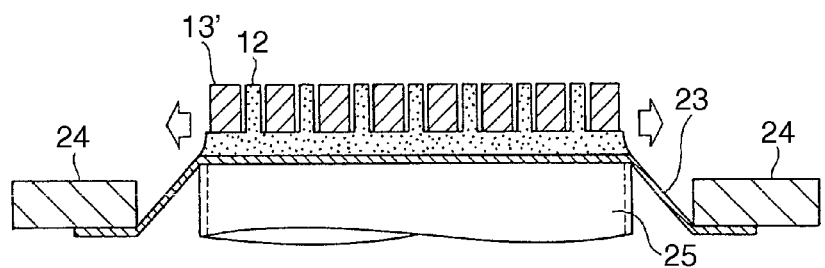
FIG. 15 is a schematic sectional view of a step of picking up the segmented chips.

The ring frame 24 on which the laminate exposing the ground surface (segmented chip 13') has been placed by a pickup device, is placed on a fixing table of the pickup device, and a uniform tension is acted on the second adhesive sheet 23 to expand it. Simply speaking, a doughnut-shaped cylindrical ring member 25 as shown in FIG. 15 is protruded beyond the back surface of the second adhesive sheet 23, so that a uniform tension acts on the second adhesive sheet 23. Here, the adhesive layer 12, too, is simultaneously expanded. Therefore, the distance increases among the segmented chips 13', and gaps are formed between the segmented chips 13' and the adhesive layer 12. This makes it easy to pick up the segmented chips that will be described later and to recognize the chip positions. In order that the second adhesive sheet 23 is not broken when it is expanded by the application of a uniform tension, it is desired that the second adhesive sheet 23 has a tensile strength of not smaller than 10 N/cm and an elongation percentage at breaking point of not smaller than 200%. The above values are measured in compliance with the JIS Z 0237 (a test piece of a width of 15 mm is cut and pulled by using a tensile tester at a speed of about 5 mm a second maintaining a distance between the indicators of 50 mm, to measure the load and elongation at breaking).

Figure 16:
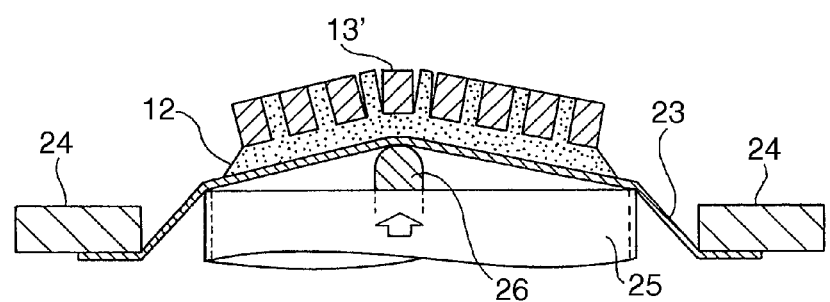
FIG. 16 is a schematic sectional view of a step of picking up the segmented chips.
Figure 17:
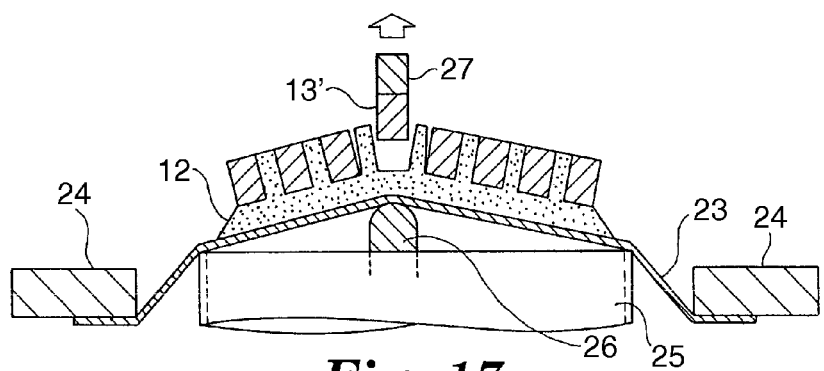
FIG. 17 is a schematic sectional view of a step of picking up the segmented chips.

Referring next to FIG. 16, a pickup tool is brought to the position of the chip, and the segmented chip 13' is knocked up from the back surface side of the second adhesive sheet 23 by using a knock-up pin 26. Referring to FIG. 17, the chip 13' is picked up by using a collet 27 having an adsorbing function. To accelerate the formation of gap between the segmented chip 13' and the adhesive layer 12, it is desired that the radius of curvature at the end of the knock-up pin 26 is equal to the size of the chip that is segmented or is so small as will not damage the chip or the second adhesive sheet 23. Further, to easily pick up the chip, it is desired that the adhering force of the adhesive layer 12 relative to the material to be ground is 0.1 to 0.5 N/25 mm and, more preferably, 0.1 to 0.2 N/25 mm. The adhering force is a value measured in compliance with the JIS Z 0237 (A test piece of a width of 25 mm is cut and is press-adhered onto a test plate by causing it to undergo a round trip at a speed of 5 mm a second by using a rubber roller of 2.0 Kg. During a period of 20 to 40 minutes after press-adhered, the test piece is peeled by using a tension tester in a direction of 180° at a speed of 300±30 mm a minute. The material to be adhered is a SUS430BA plate).

When the segmented chip 13' that is picked up is a semiconductor chip, the chip may, then, be mounted on a substrate. Here, the collet 27 adsorbs the ground surface side of the segmented chip 13' to pick it up. Therefore, attention must be given to the mounting surface when the segmented chip 13' is to be mounted on the substrate. That is, there is no problem when the segmented chip 13' is mounted with its circuit surface side (wafer surface forming the half-cut portion) on the substrate. When the segmented chip 13' is to be mounted with its ground surface side on the substrate, however, the operation is necessary such as turning the segmented chip 13' upside down (flip the chip), as required.

EXAMPLES

Examples of the invention will now be described.

Example 1

There was prepared a solution (solvent: propylene glycol methyl ether acetate) containing 10% by weight of a composition shown in Table 1. A glass substrate (TEMPAX (registered trademark) of a diameter of 152 mm×thickness of 1 mm was spin-coated with the above solution which was, then, dried to obtain a glass support material (rigid support material) having a light-heat conversion layer that served as the exfoliation layer. There were further prepared a liquid adhesive of the ultraviolet ray-curing type shown in Table 2 and a 6-inch silicon bear water of the shape of a lattice of a side of 3 mm having half-cut of a depth of 420 µm. The liquid adhesive possessed a viscosity of 1050 cps at 25° C. by using the Brookfield viscometer (BM) having a rotor shape of No. 2 at a rotational speed of 12 rpm. According to a data sheet of SCHOTT Co., it was estimated that the glass support material possessed a flexural modulus of elasticity of about 63,000 MPa.

First, the half-cut surface of the silicon bear wafer was spin-coated with the above liquid adhesive that was placed thereon, the glass support material was stuck therewith in a vacuum vessel in a manner that the exfoliation layer on the glass support material was in contact with the liquid adhesive, which was, then, irradiated with ultraviolet rays in a dose of 1000 mJ/cm$^2$ to cure the liquid adhesive thereby to obtain a laminate of water/adhesive layer/exfoliation layer/glass support material. The exfoliation layer possessed a thickness of 1 µm and the adhesive layer possessed a thickness of 50 µm. The adhesive layer after cured possessed storage moduli of elasticity of 424.4 MPa at 25° C. and 98.6 MPa at 50° C. The storage modulus of elasticity was measured by using a SOLIDS ANALYZER RSA II manufactured by Rheometrix Co. in a temperature ramp mode, a tension mode, a frequency of 1 Hz, a strain of 0.04%, a temperature ramp rate of 5° C./min and by using an adhesive of a sample size of 22.7 mm×10 mm×50 µm.

The thus obtained laminate was set on a grinder, ground such that the thickness of the wafer (chip) became 400 µm, and the half-cut wafer was divided into the individually segmented chips. After the grinding, the ground surface was observed, but there was found no such problem as chip jumping or chipping.

There was prepared a ring frame lined with a sticky sheet #N4605 (SUMILITE (trademark) SL-N4000 Series) (manufactured by Sumitomo Bakelite Co.) as the first adhesive sheet as shown in Tables 3 and 4. The sticky sheet was stuck onto the ground surface of the laminate by using a roller as shown in FIG. 5, and was fixed to a vacuum bed seat as shown in FIG. 6. As shown in FIG. 7, the exfoliation layer was pyrolyzed by the irradiation with a YAG laser (wavelength of 1064 nm) with a laser output of 6.0 W, a beam diameter and a scanning pitch of 100 µm and a scanning speed of 1.0 m/sec. The glass support material could be easily exfoliated and removed as shown in FIG. 8.

Referring next to FIG. 9, a ring frame was placed on a cylindrical bed seat of a glass having a diameter of 152 mm in a manner that the laminate did not protrude beyond the bed seat portion, and was vertically pushed down. A ring frame lined with a sticky tape #6K87 (surface protection tape)

(manufactured by Sumitomo 3M Co.) as a second adhesive sheet was stuck to the laminate while being pressed by a roller as shown in FIG. 11. Referring to FIG. 12, ultraviolet rays were projected with a dose of 300 mJ/cm$^2$ from the back surface of the cylindrical bed seat of glass to lower the sticking force of the first adhesive sheet, and the laminate was flip-transferred onto the second adhesive sheet as shown in FIG. 13.

The thus obtained laminate/second adhesive sheet were set on a die bonder, and the position thereof was determined after having expanded the second adhesive sheet. Thereafter, it was attempted to pick up the chips by using collets. The segmented chips could be picked up.

Comparative Examples 2 to 5

The same procedure was repeated by using sticky sheets of Comparative Examples 2 to 5, and inconvenience occurred in the step of flip transfer or in the pickup step. In Comparative Examples 2 and 3, a sheet #3305 (manufactured by Sumitomo 3M Co.) used as the second adhesive sheet did not expand well, and inconvenience occurred at the time of expanding the sheet and picking up the chips in the pickup step. In Comparative Examples 4 and 5, a difference in the adhering force was not enough between the first adhesive sheet and the second adhesive sheet, and a problem of exfoliation occurred at the time of transferring the laminate in the step of flip-transfer.

TABLE 1

| Chemical name | Trade name | Weight percentage |
| --- | --- | --- |
| Carbon black | Sevacarb | 25.0% |
| Silica | Aerosil A200 | 32.5% |
| Dispersing agent | Disperbyk 161 | 7.5% |
| Acrylic resin | Joncryl 690 | 35.0% |
| Total | | 100.0% |

Sevacarb (Colombian Carbon Japan Co.)
Aerosil A200 (Nihon Aerosil Co.)
Disperbyk 161 (Bigchemy Japan Co.)
Joncryl 690 (Johnson Polymer Co.)

TABLE 2

| Chemical name | Trade name | Weight percentage |
| --- | --- | --- |
| Urethane acrylate | UV6100B | 57.1% |
| 1,6 Hexanediol acrylate | 1,6-HX-A | 38.1% |
| Photoreaction initiator | Irgacure 369 | 4.8% |
| Total | | 100.0% |

UV6100B (Nihon Gosei Kagaku Co.)
1,6-HX-A (Dycel UCB Co.)
Irgacure 369 (Chiba Specialty Chemicals Co.)

TABLE 3

| Product No. | Manufacturer | Tensile strength (N/cm) | Elongation (%) | Adhering force (N/cm) |
| --- | --- | --- | --- | --- |
| #6K25 | Sumitomo 3M | 25.0 | 400 | 0.58 |
| #6K87 | Sumitomo 3M | 25.0 | >300 | >2.00 |
| #3305 | Sumitomo 3M | 78.4 | 125 | >7.00 |
| #N4605 | Sumitomo Bakelite | 34.0 | 800 | before UV: 1.20 after UV: 0.08 |

TABLE 4

| | 1st adhesive tape | 2nd adhesive tape | Flip-transfer | Pickup |
| --- | --- | --- | --- | --- |
| Example 1 | #4605 | #6K87 | OK | OK |
| Comp. Ex. 2 | #4605 | #3305 | OK | NG |
| Comp. Ex. 3 | #6K25 | #3305 | OK | NG |
| Comp. Ex. 4 | #6K25 | #N4605 | NG | (OK) |
| Comp. Ex. 5 | #6K25 | #6K25 | NG | (OK) |

The invention claimed is:

1. A method of producing segmented chips by grinding a back surface of a material to be ground which includes a plurality of chips segmented into individual chips by at least partly cutting the chips in the direction of thickness thereof along the boundaries of the chips; wherein gaps among the individual chips formed by cutting are filled with a liquid adhesive, said material to be ground is laminated, with its back surface exposed, on a rigid support material, and said adhesive is cured or solidified to form a laminate of the material to be ground having the plurality of chips;

said laminate is ground from the back surface side of said material to be ground thereby to obtain thin and individually separated chips on the laminate;

said rigid support member is removed from said laminate;

a flexible adhesive sheet is adhered onto the adhesive solid material of the laminate from which said rigid support material has been removed; and the individual chips held by the adhesive solid material on said flexible adhesive sheet are picked up and recovered, including a transfer step in which after the grinding, said laminate is adhered onto a first flexible adhesive sheet so as to come in contact with the back surfaces of said chips, said rigid support material is removed from said laminate, a second flexible adhesive sheet is adhered to the adhesive solid material of the laminate from which said rigid support material has been removed, and said first flexible adhesive sheet is removed.

2. A method of producing segmented chips according to claim 1, wherein in said transfer step, said first flexible adhesive sheet and said second flexible adhesive sheet are both pressure-sensitive adhesive sheets, and the adhering force of said second flexible adhesive sheet is two or more times as great as that of said first flexible adhesive sheet.

3. A method of producing segmented chips according to claim 1, wherein in said transfer step, the adhering force of said first flexible adhesive sheet becomes smaller than that of said second flexible adhesive sheet upon the application of heat or radiation thereby to allow the transfer.

4. A method of producing segmented chips by grinding a back surface of a material to be ground which includes a plurality of chips segmented into individual chips by at least partly cutting the chips in the direction of thickness thereof along the boundaries of the chips; wherein gaps among the individual chips formed by cutting are filled with a liquid adhesive, said material to be ground is laminated, with its back surface exposed, on a rigid support material, and said adhesive is cured or solidified to form a laminate of the material to be ground having the plurality of chips;

said laminate is ground from the back surface side of said material to be ground thereby to obtain thin and individually separated chips on the laminate;

said rigid support member is removed from said laminate;

a flexible adhesive sheet is adhered onto the adhesive solid material of the laminate from which said rigid support material has been removed; and the individual chips held by the adhesive solid material on said flexible adhesive sheet are picked up and recovered, wherein said liquid adhesive, at the time of filling, has a viscosity of smaller than 10,000 cps at 25° C., and the adhesive solid material after being cured or solidified has a storage modulus of elasticity of not smaller than 100 MPa at 25° C. and a storage modulus of elasticity of not smaller than 10 MPa at 50° C.

5. A method of producing segmented chips by grinding a back surface of a material to be ground which includes a plurality of chips segmented into individual chips by at least partly cutting the chips in the direction of thickness thereof along the boundaries of the chips; wherein gaps among the individual chips formed by cutting are filled with a liquid adhesive, said material to be ground is laminated, with its back surface exposed, on a rigid support material, and said adhesive is cured or solidified to form a laminate of the material to be ground having the plurality of chips;

said laminate is ground from the back surface side of said material to be ground thereby to obtain thin and individually separated chips on the laminate;

said rigid support member is removed from said laminate;

a flexible adhesive sheet is adhered onto the adhesive solid material of the laminate from which said rigid support material has been removed; and the individual chips held by the adhesive solid material on said flexible adhesive sheet are picked up and recovered, wherein in the step of picking up and recovering the individual chips held by said adhesive solid material on said flexible adhesive sheet, a tension force is exerted on said flexible adhesive sheet to expand the adhesive solid material in a horizontal direction, to thereby facilitate the picking up.

* * * * *